(12) United States Patent
Matsunaga (10) Patent No.: US 6,504,252 B2
(45) Date of Patent: Jan. 7, 2003

(54) SEMICONDUCTOR DEVICE WITH A SPLIT PAD ELECTRODE

(75) Inventor: Noriaki Matsunaga, Chigasaki (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/814,838

(22) Filed: Mar. 23, 2001

(65) Prior Publication Data
US 2002/0079584 A1 Jun. 27, 2002

(30) Foreign Application Priority Data
Dec. 27, 2000 (JP) .................................. 2000-397290

(51) Int. Cl.$^7$ .............................................. H01L 23/48
(52) U.S. Cl. ...................... 257/758; 257/622; 257/780; 257/786; 357/68
(58) Field of Search ................................ 257/410, 411, 257/622, 780, 786; 357/68; 428/693

(56) References Cited

U.S. PATENT DOCUMENTS 5,084,752 A * 1/1992 Satoh et al. .................. 357/68
6,049,135 A * 4/2000 Koike .......................... 257/780
6,136,458 A * 10/2000 Inoue ........................... 428/693

FOREIGN PATENT DOCUMENTS

| JP | 60-9235 | 1/1985 |
| JP | 61-187262 | 8/1986 |
| JP | 64-74731 | 3/1989 |
| JP | 4-318944 | 11/1992 |

* cited by examiner

Primary Examiner—David Nelms
Assistant Examiner—Mai-Huong Tran
(74) Attorney, Agent, or Firm—Finnegan, Henderson, Farabow, Garrett, & Dunner, L.L.P.

(57) ABSTRACT

A semiconductor device of the present invention comprises a first split Pad electrode which is electrically connected to wirings and a MOSFET and a second split Pad electrode which is not electrically connected to wirings and a MOSFET. Then, a passivation film which covers a part of the surface of the second split pad electrode is formed and a non-split pad electrode which covers the surfaces of the first and second split pad electrodes which are not covered with the passivation film is formed.

31 Claims, 9 Drawing Sheets

SEMICONDUCTOR DEVICE WITH A SPLIT PAD ELECTRODE

CROSS-REFERENCE TO RELATED APPLICATIONS

This application is based upon and claims the benefit of priority from the prior Japanese Patent Application No. 2000-397290, filed Dec. 27, 2000, the entire contents of which are incorporated herein by reference.

BACKGROUND OF THE INVENTION

The present invention relates to the structure of a pad electrode in a semiconductor device.

Figure 20:
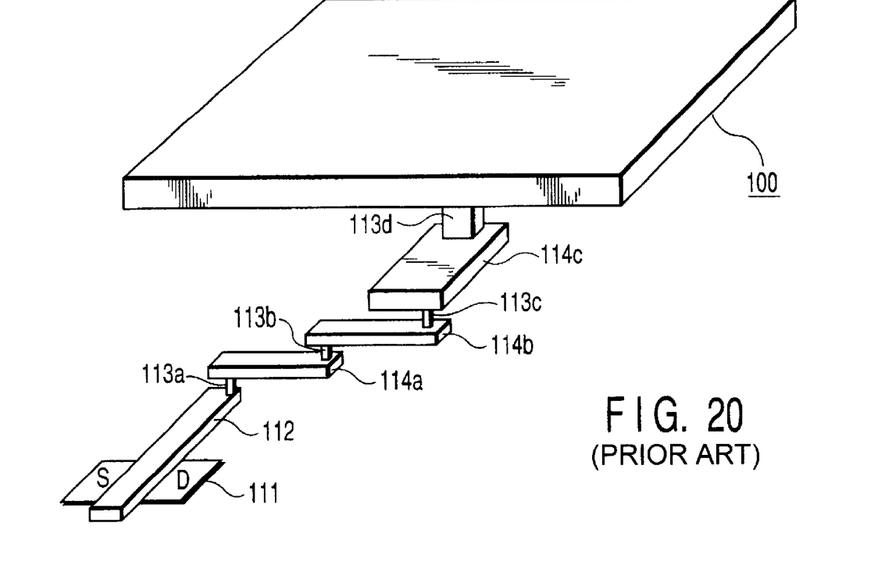
FIG. 20 is a perspective view showing a semiconductor device according to conventional technologies.
Figure 21A:
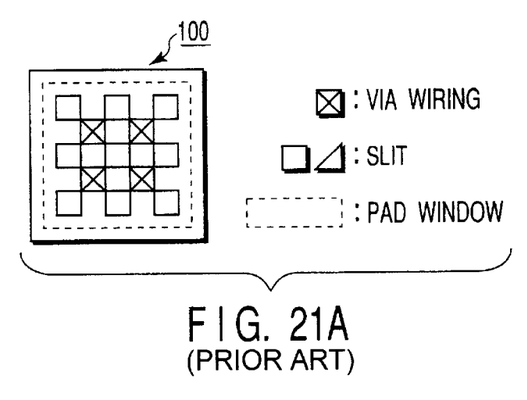
FIG. 21A is a plan view showing a pad electrode of a semiconductor device according to conventional technologies.
Figure 21B:
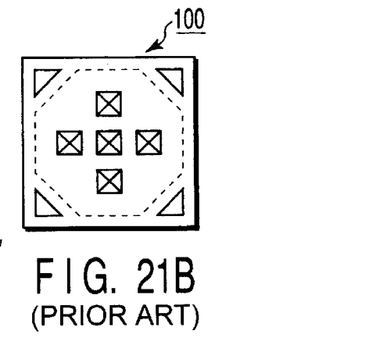
FIG. 21B is a plan view showing a pad electrode of a semiconductor device according to conventional technologies.
Figure 21C:
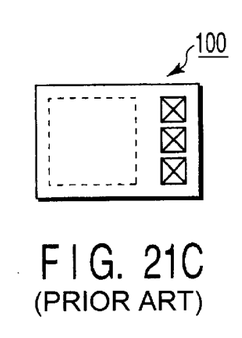
FIG. 21C is a plan view showing a pad electrode of a semiconductor device according to conventional technologies.
Figure 21D:
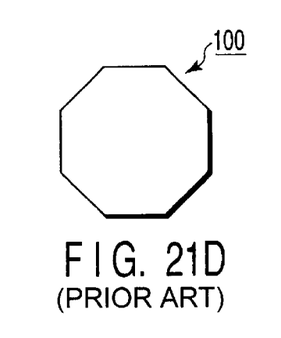
FIG. 21D is a plan view showing a pad electrode of a semiconductor device according to conventional technologies.
Figure 21E:
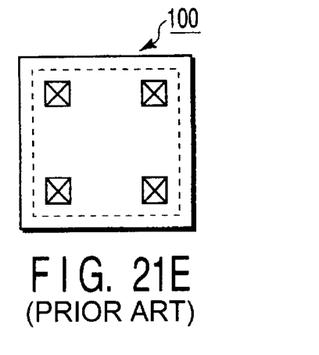
FIG. 21E is a plan view showing a pad electrode of a semiconductor device according to conventional technologies.

FIG. 20 is a perspective view showing a pad electrode and its peripheral parts in a semiconductor device according to conventional technologies. FIG. 21 is a plan view showing a pad electrode manufactured based on conventional technologies.

As shown in FIG. 20, a gate electrode 112 of a MOSFET 111 is connected to a first layer wiring 114a through a via wiring 113a and the first layer wiring 114a is connected to a second layer wiring 114b through a via wiring 113b. This second layer wiring 114b is connected to a third layer wiring 114c through a via wiring 113c and the third layer wiring 114c is connected to a pad electrode 100 through a via wiring 113d.

This pad electrode 100 is a plate electrode having a relatively large area allowing wire bonding and bump connection. The pad electrode 100 is electrically connected to the MOSFET 111 through the via wirings 113a, 113b, 113c and 113d and the wirings 114a, 114b and 114c.

Also, as shown in FIG. 21A to FIG. 21E, the pad electrode 100 is provided with a slit to make a part thereof form a net or a cut is made in the pattern of the pad electrode 100 as the case may be for the purpose of decreasing stress.

Such a pad electrode 100 has a charging damage problem as the well-known inferior problem. This problem is that a charge is injected into the wirings 114a, 114b and 114c by a plasma used in the manufacturing process and stress is thereby applied to a gate insulating film of the MOSFET 111 with the result that the fundamental characteristics of the MOSFET are deteriorated. A plasma causes a charge to be injected from an exposed surface of a conductor such as the wirings 114a, 114b and 114c. Therefore, the larger the surface area of each of the wirings 114a, 114b and 114c to be connected to the gate electrode 112 is, the more easily a charge from the plasma is collected and the more easily the gate insulating film is damaged.

In view of this, in order to prevent the charging damage, measures are taken to restrict the length of each of the wirings 114a, 114b and 114c connected to the gate electrode 112 thereby decreasing the surface area.

However, as aforementioned, a relatively large area is required for the pad electrode 100 to allow wire bonding and bump connection. Generally, many of pad electrodes 100 have a size of about 50 $\mu$m to 100 $\mu$m (2500 $\mu m^2$ to $1 \times 10^4$ $\mu m^2$). Although such a pad electrode 100 is a charge collector having a large area, the pad electrode 100 is concerned in many plasma steps including a RIE (Reactive Ion Etching) processing step of the pad electrode 100, a resist ashing step of the pad electrode 100 after it was processed, a step of depositing a passivation film on the pad electrode 100, an etching step for opening a pad window and a step of peeling off a resist after the pad window is opened.

Therefore, if the pad electrode 100 has a large area, a charge from a plasma is collected with ease, causing charging damage.

For this, a protective diode is conventionally connected to each pad electrode 100 to avoid the charging damages to the pad electrode 100. However, a recent trend in high speed LSIs is a decrease in the junction capacity to accomplish high speed transistors. This is the same with the case of increasing the withstand voltage of the protective diode. To state examples of recent LSIs, junction withstand voltage has been raised to 10V. As a consequence, a stress of about 10V is applied in a process because the function as a protective diode is insufficient. In light of this, there is the case where only a protective diode section is changed in the ion concentration of ion implantation. In this case, however, the number of steps in the production of the protective diode is increased.

As outlined above, in the structure of the conventional pad electrode, it is difficult to decrease the charging damages without increasing the number of steps in the production of the protective diode.

BRIEF SUMMARY OF THE INVENTION

The present invention has been made to solve the aforementioned problem and it is an object of the present invention to provide a semiconductor device enabling a reduction in charging damages.

The present invention uses the following means to achieve the above object.

A first semiconductor device according to a first aspect of the present invention is a semiconductor device provided with a semiconductor element and a wiring, the device comprising a first split pad electrode which is electrically connected to the semiconductor element through the wiring, a second split pad electrode which is disposed adjacent to and apart from the first split pad electrode and is not electrically connected to the semiconductor element, a passivation film which covers a part of the surface of the second split pad electrode and a non-split pad electrode covering the surfaces of the first and second split pad electrodes which are not covered by the passivation film.

A second semiconductor device according to a second aspect of the present invention is a semiconductor device provided with a semiconductor element and a wiring, the device comprising a first split pad electrode which is electrically connected to the semiconductor element through the wiring and a second split pad electrode which is disposed adjacent to and apart from the first split pad electrode and is not electrically connected to the semiconductor element, wherein pad electrodes each constituted by the first and second split pad electrodes are laminated.

A third semiconductor device according to a third aspect of the present invention is a semiconductor device provided with a signal line and a power line, wherein at least a part of a pad electrode for the signal line uses a split pad electrode which is split into a first split pad electrode which is electrically connected to a semiconductor element through a wiring and a second split pad electrode which is disposed adjacent to and apart from the first split pad electrode and is not electrically connected to the semiconductor element and a pad electrode for the power line uses a non-split pad electrode which is electrically connected to the semiconductor element through a wiring.

A fourth semiconductor device according to a fourth aspect of the present invention is a semiconductor device provided with a semiconductor element and a wiring, the device comprising an island-like first split pad electrode which is electrically connected to the semiconductor element through the wiring, a second split pad electrode which is disposed around and apart from the first split pad electrode and is not electrically connected to the semiconductor element, a passivation film which covers a part of the surface of the second split pad electrode and a connecting member disposed on the exposed surface of a pad electrode constituted by the first and second split pad electrodes, wherein a contact surface between the connecting member and the pad electrode is formed in such a manner as to surround the inner periphery of the second split pad electrode.

A fifth semiconductor device according to a fifth aspect of the present invention is a semiconductor device provided with a semiconductor element and a wiring, the device comprising a first split pad electrode which is electrically connected to the semiconductor element through the wiring, a second split pad electrode which is disposed adjacent to and apart from the first split pad electrode and is not electrically connected to the semiconductor element and a passivation film which covers a part of the surface of the second split pad electrode, wherein the surfaces of the first and second split pad electrodes are exposed in the same opening of the passivation film.

As mentioned above, according to the first to fifth semiconductor devices of the present invention, only the surface area of the first split pad electrode connected to wirings and semiconductor elements can be minimized without changing the effective surface area of the pad electrode. Because the area of a conductor which is to be a charge introduction port in a plasma step in the production of a semiconductor device is therefore decreased, charging damages can be prevented and the deterioration of the semiconductor device can be prevented. In addition, a contact surface required for bonding and the like can be secured, enabling sufficient bonding.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 18J is a plan view showing the pattern of a split pad electrode according to the fifth embodiment of the present invention.

FIG. 18K is a plan view showing the pattern of a split pad electrode according to the fifth embodiment of the present invention.

DETAILED DESCRIPTION OF THE INVENTION

Embodiments of the present invention will be hereinafter explained with reference to the drawings. In this explanations, parts common between the drawings are represented by the same reference symbols over all drawings.

(First embodiment)

A first embodiment shows a structure which is a base of the present invention. The present invention is characterized by the fact that a pad electrode for probing or connection to a connecting member such as a bonding wire and a bump is split into a part electrode which is electrically connected to wirings and semiconductor elements and a part electrode which is not electrically connected to wirings and semiconductor elements.

Figures 1, 2:
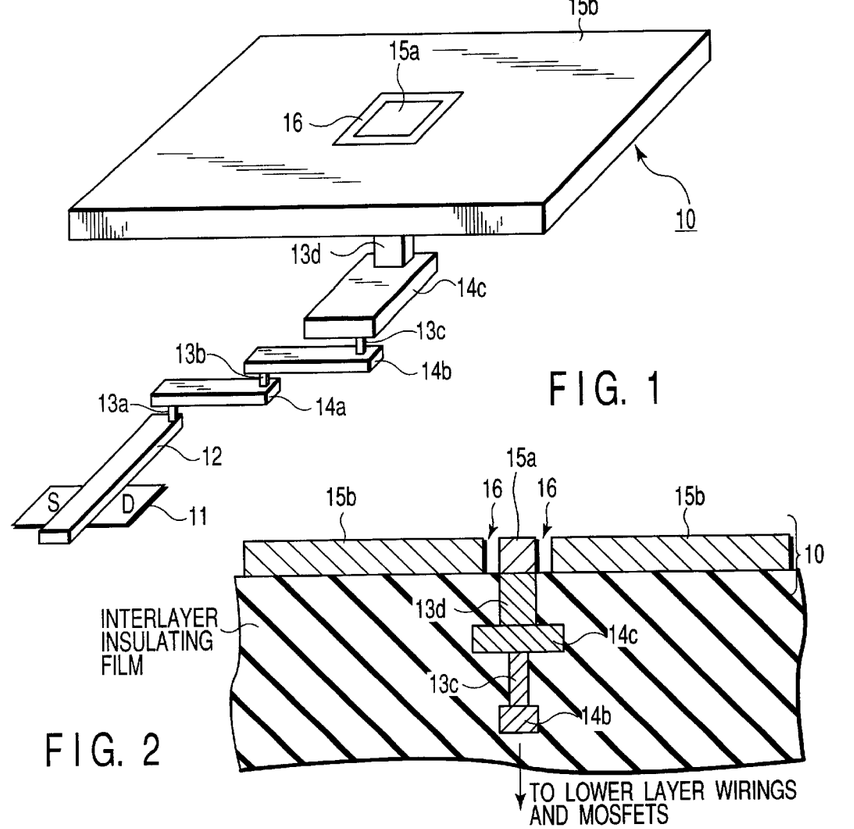
FIG. 1 is a perspective view showing a semiconductor device according to a first embodiment of the present invention.
FIG. 2 is a sectional view showing a semiconductor device according to the first embodiment of the present invention.

FIG. 1 shows a perspective view of a part of a semiconductor device according to the first embodiment of the present invention. FIG. 2 shows a sectional view of a part of a semiconductor device according to the first embodiment of the present invention. In FIG. 1, an interlayer insulating film is omitted.

As shown in FIG. 1 and FIG. 2, a gate electrode 12 of a MOSFET 11 is connected to a first layer wiring 14a through a via wiring 13a and the first layer wiring 14a is connected to a second layer wiring 14b through a via wiring 13b. This second layer wiring 14b is connected to a third layer wiring 14c through a via wiring 13c and this third layer wiring 14c is connected to a first split pad electrode 15a of a pad electrode 10 through a via wiring 13d. A second split pad electrode 15b of the pad electrode 10 is disposed with a clearance 16 near the film thickness (for example, 1 μm) of the pad electrode 10 to the first split pad electrode 15a so as to surround the first split pad electrode 15a.

Here, the first split pad electrode 15a is, for example, a 2 μm by 2 μm square. The second split pad electrode 15b is, for example, a 100 μm by 100 μm square with void inside.

As outlined above, the pad electrode 10 used in the present invention comprises the first split pad electrode 15a disposed in the center and the second split pad electrode 15b disposed apart from the first split pad electrode 15a so as to surround the first split pad electrode 15a. The first split pad electrode 15a is connected to the wirings 14a, 14b and 14c and to the MOSFET 11 in the semiconductor device whereas the second split pad electrode 15b is not connected to the wirings 14a, 14b and 14c and to the MOSFET 11 in the semiconductor device. Namely, the second split pad electrode 15b is made to be a floating electrode.

Figure 3:
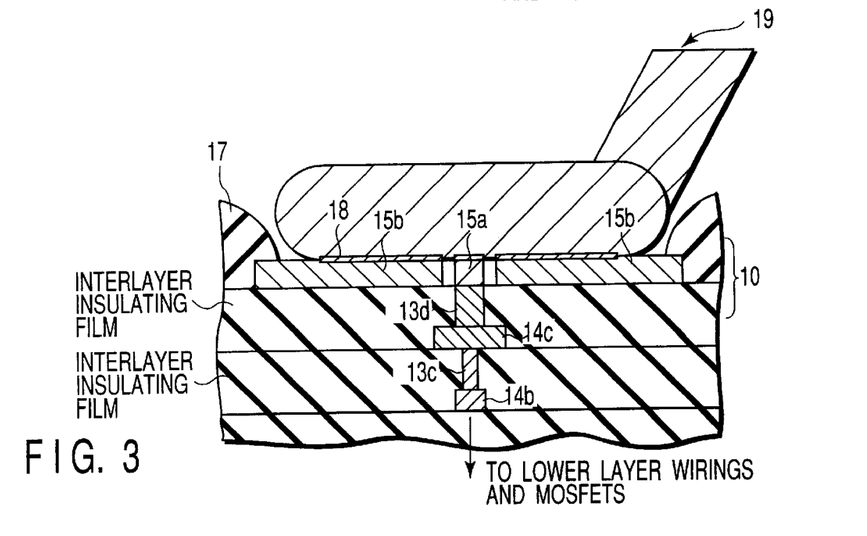
FIG. 3 is a sectional view showing the condition of a semiconductor device according to the first embodiment of the present invention on which a bonding wire is formed.

FIG. 3 is a sectional view showing the condition of the semiconductor device on which bonding to the pad electrode shown in FIG. 2 is conducted. As shown in FIG. 3, a part of the second split pad electrode 15b is covered with a passivation film 17. A bonding wire 19 is bonded onto the first and second split pad electrodes 15a and 15b, which are not covered with the passivation film 17, through an alloy layer 18.

Figure 4:
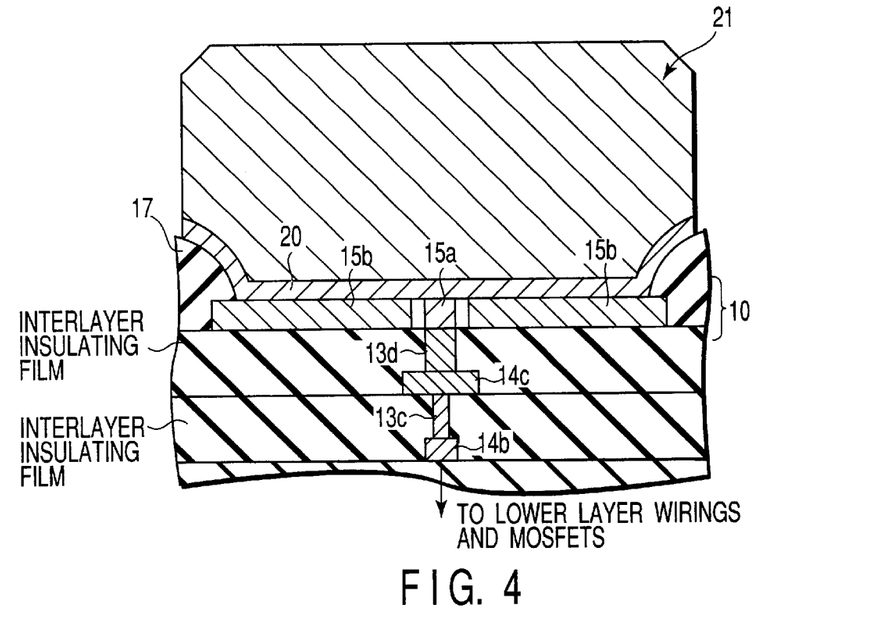
FIG. 4 is a sectional view showing the condition of a semiconductor device according to the first embodiment of the present invention on which a bump is formed.

FIG. 4 shows a sectional view of the semiconductor device in the condition that bump connection to the pad electrode shown in FIG. 2 is made. As shown in FIG. 4, after a part of the second split pad electrode 15b is covered with the passivation film 17, a bump 21 is formed on the entire surface through an interposing layer 20 and the bump 21 and the interposing layer 20 are patterned.

As shown in FIG. 3 and FIG. 4, because the first split pad electrode 15a to be connected to the MOSFET 11 and the like has an extremely small area, but the second split pad electrode 15b disposed around the first split pad electrode 15a has a sufficiently large area, the effective area of the pad electrode 10 is almost unchanged. Therefore, the contact area between the pad electrode 10 and both of the bonding wire 19 and the bump 21 is not much different from that of a conventional device, enabling sufficient bonding.

Figure 5:
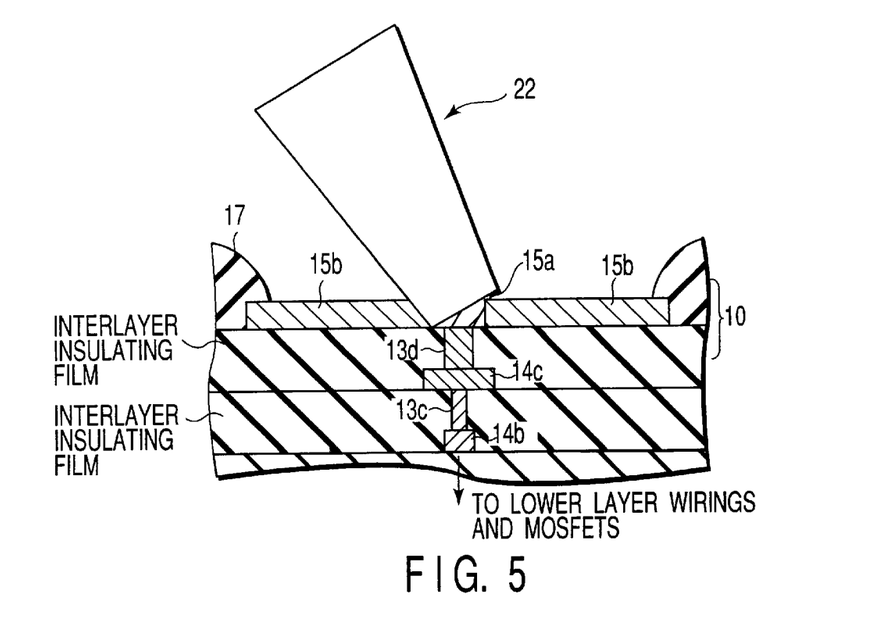
FIG. 5 is a sectional view showing the condition of a semiconductor device according to the first embodiment of the present invention with which a probe is brought into contact.

FIG. 5 shows a sectional view of the condition of the semiconductor device in which probing is conducted on the pad electrode shown in FIG. 2.

In usual probing, a probe 22 slides on the pad electrode 10 and breaks a natural oxide film on the surface of a material (e.g., Al) of the pad electrode 10 and intrudes thereinto. By these breaking actions, the first split pad electrode 15a is connected to the second split pad electrode 15b during probing as shown in FIG. 5. Therefore, also in probing for the evaluation of the semiconductor device, electrical connection of the pad electrode 10 can be achieved sufficiently.

According to the first embodiment, the pad electrode 10 is split into the first split pad electrode 10 disposed in the center and the second split pad electrode 15b which is disposed apart from the first split pad electrode 15a so as to surround the first split pad electrode 15a. The first split pad electrode 15a is connected to wirings and a MOSFET and the second split pad electrode 15b is not electrically connected to wirings and a MOSFET.

Accordingly, only the surface area of the first split pad electrode 15a to be connected to wirings and a MOSFET can be minimized without changing the effective surface area of the pad electrode. Therefore, because the area of a conductor which is a charge introduction port is decreased, charging damages can be prevented and deterioration of the MOSFET can be suppressed in a plasma step of the process for the production of the semiconductor device. In addition, since the contact surface required for wire bonding and bump connection can be secured enough, sufficient bonding can be accomplished.

In the meantime, generally, when a pad electrode is split, a clearance is formed between the split pad electrodes and the side surface of the split pad electrode is exposed. If this side surface is brought into contact directly with a resin for sealing a semiconductor device, there is the case where the pad electrode is corroded from the exposed side surface of the pad electrode by, for example, the interaction between the water intruded from the outside through this resin and ionic impurities in the resin. For this, in order to prevent the corrosion of the exposed side surface of the pad electrode, there is the idea that the clearance between the split pad electrodes is covered with a passivation film. In this case, the surface of each of the split pad electrodes is exposed from each different opening formed in the passivation film. However, the passivation film covering the clearance is sometimes broken during bonding and its residue causes the durability during bonding to be impaired.

In the first embodiment, on the other hand, as to the condition after the bonding is finished as shown in FIG. 3 and FIG. 4, bonding can be carried out such that the contact surface between both the bonding wire and the bump and the pad electrode 10 surrounds the inner periphery of the second split pad electrode 15b disposed so as to surround the island-like first split pad electrode 15a. Therefore, the clearance 16 between the first split pad electrode 15a and the second split pad electrode 15b can be completely covered with the bonding wire and the bump and the side surface of each of the first and second split pad electrodes 15a and 15b is not exposed. The surface of each of the first and second split pad electrodes 15a and 15b is exposed from one opening of the passivation film 17 covering the peripheral part of the second split pad electrode 15b and the passivation film is not formed so as to cover the clearance splitting the pad electrode and this makes it possible to be free from the problem that the durability during bonding is impaired. Also, to prevent the corrosion of the pad electrode from the clearance between the split pad electrodes as aforementioned, it is more preferable that the clearance between the first split pad electrode and the second split pad electrode be filled with an insulating film by using a damascene structure shown in a second embodiment explained later.

Incidentally, it is unnecessary to provide a protective diode as is used conventionally since charging damages can be avoided as aforementioned. Therefore, it is needless to say that this makes it possible to be freed of the problem described in the paragraph "Prior Art", specifically, the problem of an increase in the number of production steps which problem is posed in the formation of the protective diode.

(Second embodiment)

The second embodiment comprises covering the surface of the split pad electrode shown in the first embodiment with a metal.

Figure 6:
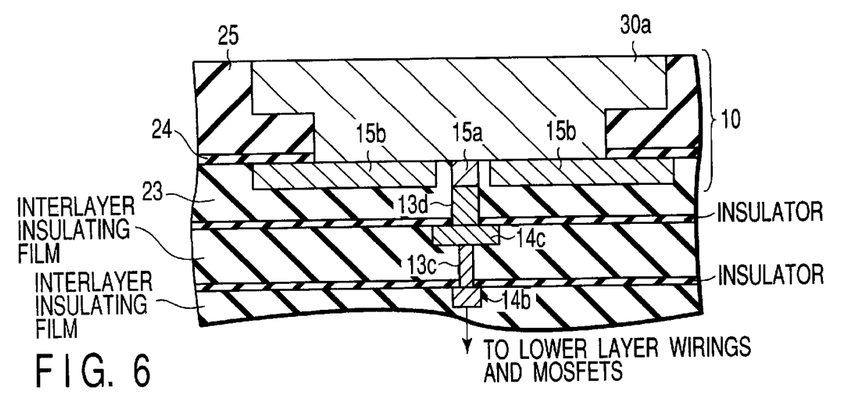
FIG. 6 is a sectional view showing a semiconductor device formed using a CMP according to a second embodiment of the present invention.

FIG. 6 partly shows a sectional view of a semiconductor device according to the second embodiment of the present invention. As shown in FIG. 6, the semiconductor device according to the second embodiment comprises a first split pad electrode 15a which is electrically connected to wirings 14b and 14c and a MOSFET and a second split pad electrode 15b which is not electrically connected to the wirings 14b and 14c and a MOSFET in the same manner as in the first embodiment. A passivation film 25 covering a part of the surface of the second split pad electrode 15b is formed and a non-split pad electrode 30a covering the surfaces of the first and second split pad electrodes 15a and 15b which are not covered with this passivation film 25 is formed. This non-split pad electrode 30a is formed by CMP (Chemical Mechanical Polish).

In FIG. 6, a silicon nitride film 24 formed on the first and second split pad electrodes 15a and 15b and an insulating film formed on each of the wirings 14b and 14c are insulating films for preventing the diffusion of electrode materials and wiring materials.

FIG. 7 to FIG. 11 respectively show a part of a sectional view of a process for manufacturing the semiconductor device according to the second embodiment of the present invention. A process of the manufacturing of the semiconductor device of the present invention will be hereinafter explained.

Figure 7:
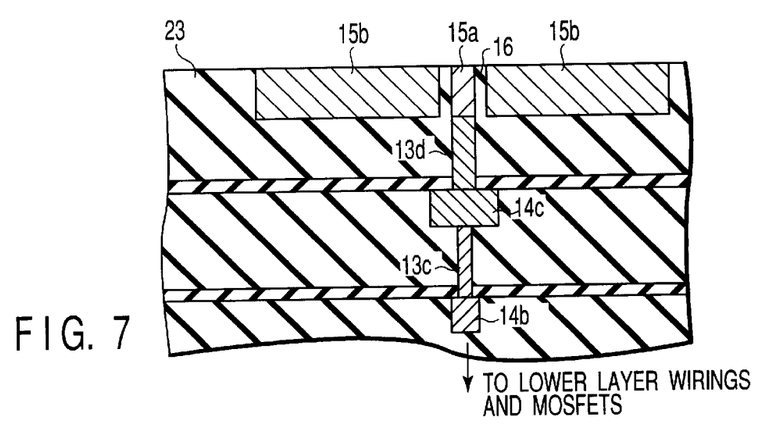
FIG. 7 is a sectional view showing a process of manufacturing a semiconductor device according to the second embodiment of the present invention.

First, as shown in FIG. 7, a MOSFET is formed using known technics and the wirings 14b and 14c and via wirings 13c and 13d which are made of, for example, Cu and connected to this MOSFET are formed. Next, in an interlayer insulating film 23, the first split pad electrode 15a which is connected to the via wiring 13d and has a damascene structure is formed and the second split pad electrode 15b with the clearance 16 to the first split pad electrode 15a and has a damascene structure is formed.

Figure 8:
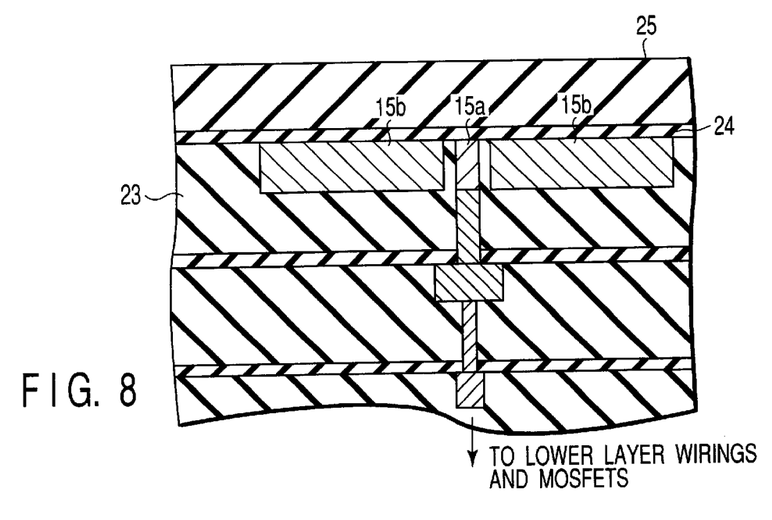
FIG. 8 is a sectional view showing a process of manufacturing a semiconductor device according to the second embodiment of the present invention in succession to the process shown in FIG. 7.

Then, as shown in FIG. 8, a silicon nitride film 24 is formed on the entire surface and the passivation film 25 is formed on the silicon nitride film 24. This passivation film 25 is a laminate film of, for example, silicon oxide film formed by a CVD method using a TEOS (Tetra Ethyl Ortho Silicate) gas and a silicon nitride film.

Figure 9:
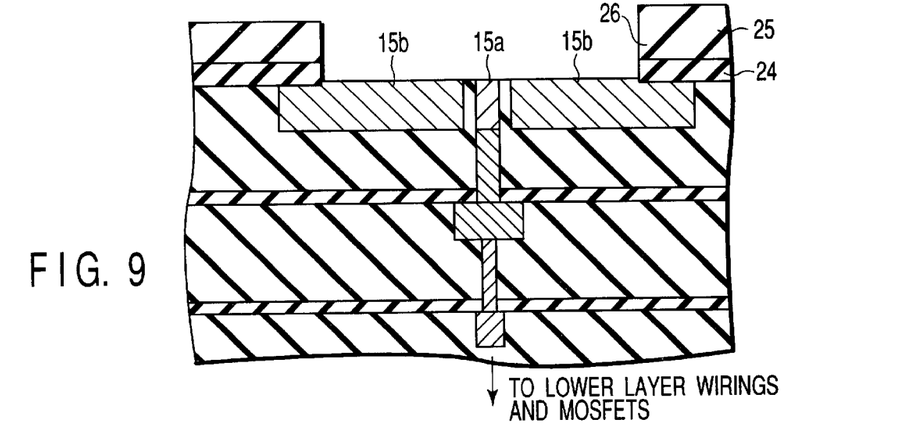
FIG. 9 is a sectional view showing a process of manufacturing a semiconductor device according to the second embodiment of the present invention in succession to the process shown in FIG. 8.

Then, as shown in FIG. 9, the passivation film 25 and the silicon nitride film 24 are selectively removed and the entire surface of the first split pad electrode 15a and a part of the surface of the second split pad electrode 15b are thereby exposed. A first groove 26 is thereby formed.

Figure 10:
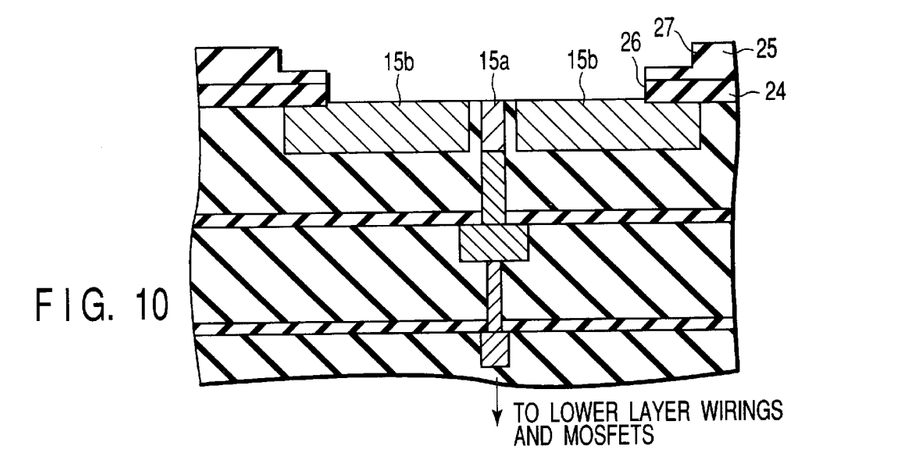
FIG. 10 is a sectional view showing a process of manufacturing a semiconductor device according to the second embodiment of the present invention in succession to the process shown in FIG. 9.

Then, as shown in FIG. 10, a part of the passivation film 25 is selective removed. A second groove 27 having an opening larger than the opening of the first groove 26 is thereby formed.

Figure 11:
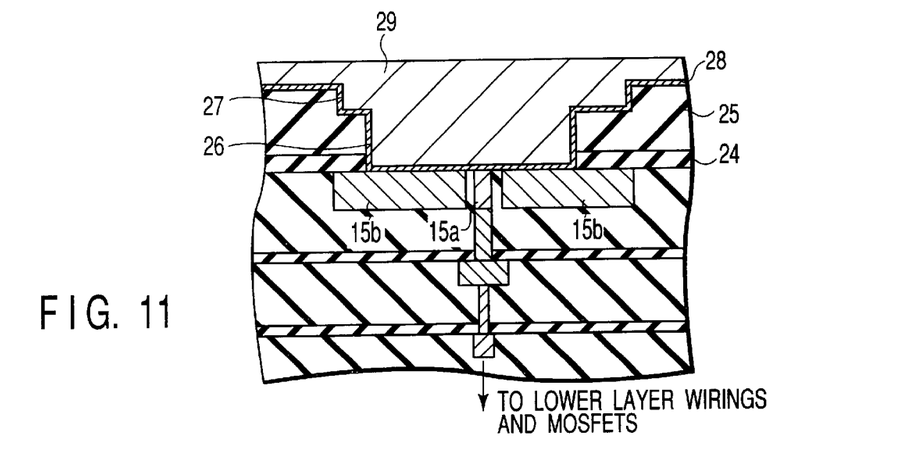
FIG. 11 is a sectional view showing a process of manufacturing a semiconductor device according to the second embodiment of the present invention in succession to the process shown in FIG. 10.

Then, as shown in FIG. 11, a barrier metal film 28 is formed on the entire surface and a metal film (e.g.,an AlCu film) 29 is formed on this barrier metal film 28. As a consequence, the first and second grooves 26 and 27 are filled in the barrier metal film 28 and the metal film 29.

Then, as shown in FIG. 6, the planarization of the metal film 29 and the barrier metal film 28 are carried out by, for example, CMP until the surface of the passivation film 25 is exposed. As a consequence, the non-split pad electrode 30a which covers the exposed surfaces of the first and second split pad electrodes 15a and 15b is formed.

In this manner, the pad electrode 10a in the second embodiment is constituted of the first and second split pad electrodes 15a and 15b and the non-split pad electrode 30a which covers the exposed surfaces of the first and second split pad electrodes 15a and 15b.

According to the aforementioned second embodiment, the first and second split pad electrodes 15a and 15b are disposed whereby the same effect as that of the first embodiment can be obtained.

Moreover, the exposed surfaces of the first and second split pad electrodes 15a and 15b are covered with the non-split pad electrode 30a. Therefore, the exposed surfaces of the first and second split pad electrodes can be prevented from being corroded by water and impurities.

Also, in the second embodiment, a damascene structure is used for the first and second split pad electrodes 15a and 15b and the surfaces of the first and second split pad electrodes 15a and 15b are covered with the non-split pad electrode 30a. For this, in the second embodiment, the corrosion of the split pad electrode from the clearance 16 can be entirely prevented. Therefore, it is unnecessary to form a passivation film so as to cover the clearance and it is therefore possible to more prevent the bonding durability from being impaired.

Figure 12:
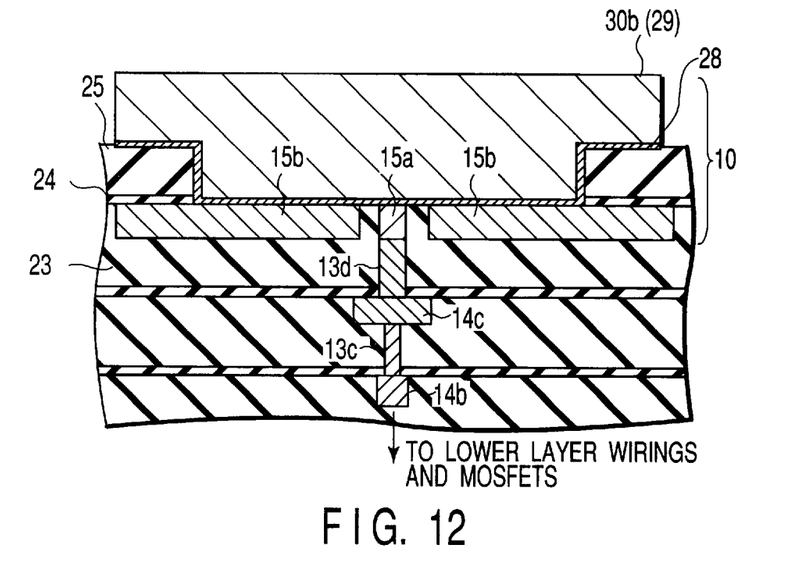
FIG. 12 is a sectional view of a semiconductor device formed by wet etching according to the second embodiment of the present invention.

The method of forming the non-split pad electrode 30*a* is not limited to the method of forming using CMP, but the non-split pad electrode 30*a* may be formed using a process using no ion to be able to evade charging damages. For example, as shown FIG. 12, the metal film 29 and the barrier metal film 28 which cover the split pad electrodes 15*a* and 15*b* may be formed by patterning using lithography and wet etching to thereby form the non-split pad electrode 30*b*.

Also, in the formation of the non-split pad electrode 30*a*, although the groove is provided with a difference in level by forming the first and second groves 26 and 27 which have different openings respectively, the groove may be provided with no difference in level. However, the groove provided with a difference in level is rather superior in the effect of preventing the intrusion of water and therefore can prevent corrosion more exactly.

(Third embodiment)

In the aforementioned first and second embodiments, the pad electrode is split into two parts, namely the first split pad electrode 15*a* connected to wirings and a MOSFET and the second split pad electrode 15*b* which is made to be a floating electrode. However, the present invention is not limited to this structure.

The third embodiment comprises plural first split pad electrodes connected to wirings and a MOSFET.

Figure 13:
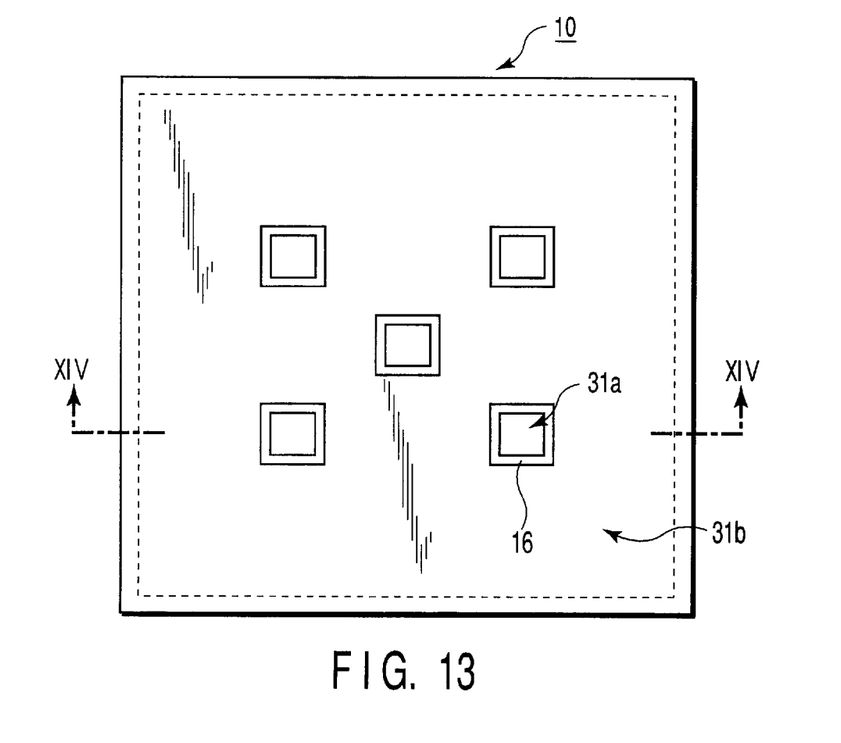
FIG. 13 is a plan view showing a split pad electrode of a semiconductor device according to a third embodiment.
Figure 14:
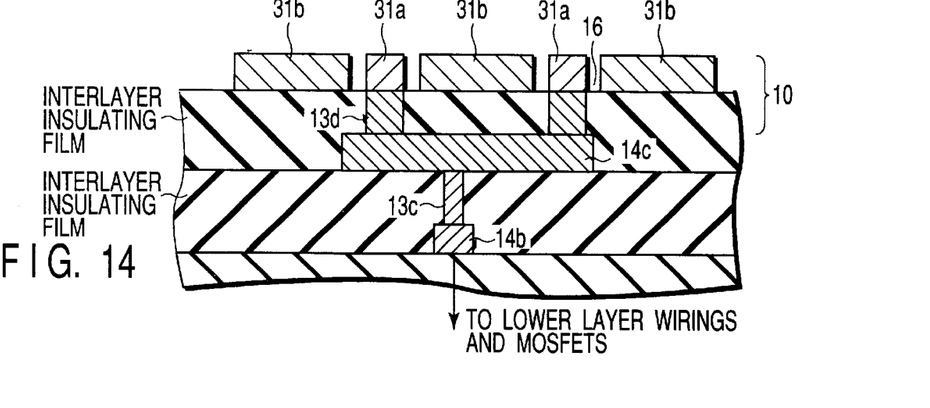
FIG. 14 is a sectional view of a semiconductor device along the line XIV—XIV shown in FIG. 13.

FIG. 13 shows a plan view of a split pad electrode of a semiconductor device according to the third embodiment of the present invention. FIG. 14 partly shows a sectional view of the semiconductor device along the line XIV—XIV shown in FIG. 13.

As shown in FIG. 13 and FIG. 14, plural first split pad electrodes 31*a* which are connected to wirings 14*b* and 14*c* and MOSFET formed in the semiconductor device are disposed dispersedly in the pad electrode 10. A second split pad electrode 31*b* is disposed with a clearance 16 to each of these first split pad electrodes 31*a* so as to surround each first split pad electrode 31*a*.

According to the third embodiment, the same effect as that of the first embodiment can be obtained by providing the first and second split pad electrodes 31*a* and 31*b*.

Further, since the first split pad electrode 31*a* connected to wirings and a MOSFET is dispersed plurally, the occurrences of connection inferiors as to connections to a bonding wire, a bump, a probe and the like can be prevented.

It is to be noted that like split pad electrodes 15*a* and 15*b* in the second embodiment, these split pad electrodes 31*a* and 31*b* may also be covered with the non-split pad electrode. In this case, not only the effects of the third embodiment are obtained but also corrosion of the split pad electrodes 31*a* and 31*b* can be prevented.

(Fourth embodiment)

Figure 15:
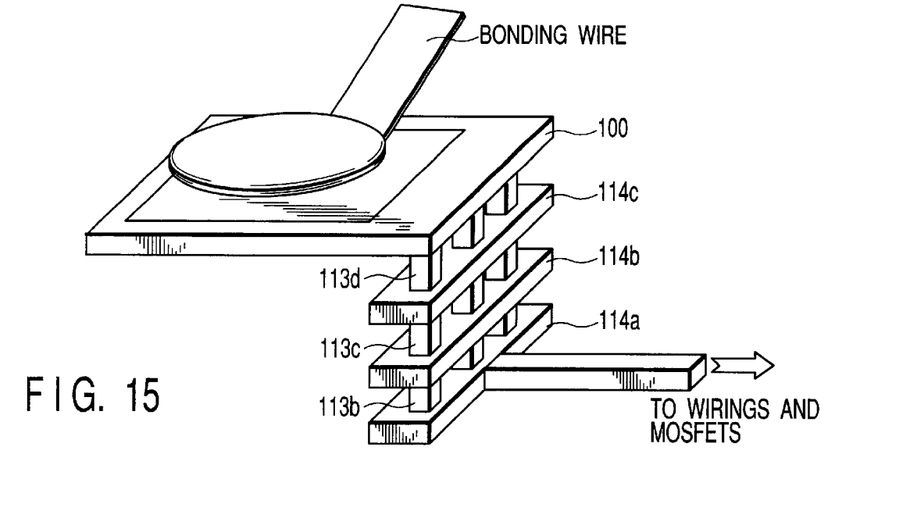
FIG. 15 is a perspective view showing a semiconductor device according to conventional technologies.

As shown in FIG. 15, it is usually only required for a pad formed on a semiconductor device to enable wire bonding and bump connection. Therefore, it is only required that a pad electrode 100 of about 100 μm is formed only on the uppermost layer and as to layers under the pad electrode 100, via wirings 113*b*, 113*c* and 113*d* are disposed and repeater wirings 114*a*, 114*b* and 114*c* are disposed above and below the via wirings.

Figure 16:
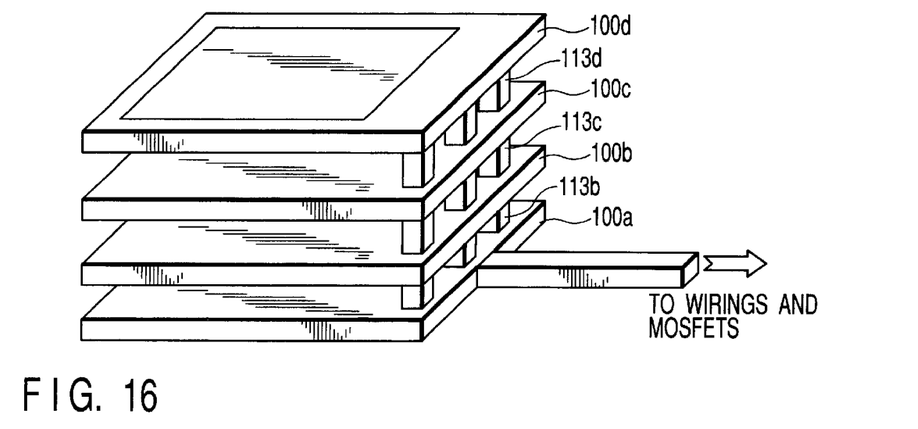
FIG. 16 is a perspective view showing a semiconductor device according to conventional technologies.

However, in the case of a pad as a test terminal used for the evaluation of various characteristics, these characteristics are occasionally evaluated in each layer. Therefore, as shown in FIG. 16, there is the case where pad electrodes 100*a*, 100*b*, 100*c* and 100*d* for a probe are required in all layers. However, when the pad electrodes 100*a*, 100*b* 100*c* and 100*d* are laminated in a conventional pad structure, the device resultantly receives charging damages in every plasma step for each layer, giving rise to the problem of the deterioration in the characteristics of the MOSFET.

In the fourth embodiment, in order to be freed of this problem, a split pad electrode is disposed in each layer in a multilayer interconnection laminate structure.

Figure 17:
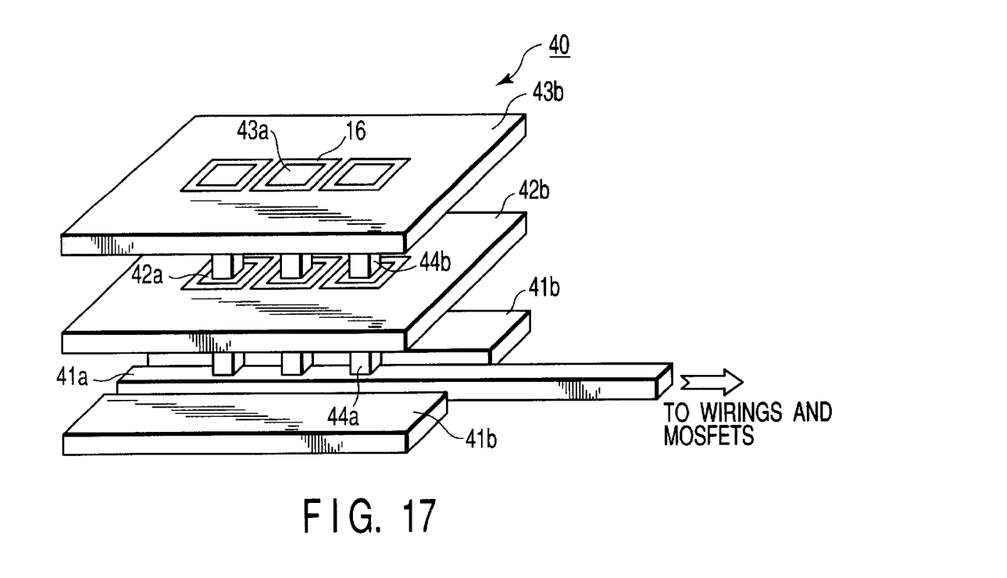
FIG. 17 is a perspective view showing a semiconductor device according to a fourth embodiment of the present invention.

FIG. 17 partly shows a perspective view of a semiconductor device according to the fourth embodiment of the present invention. As shown in FIG. 17, in the multilayer interconnection laminate structure, a pad electrode 40 in each layer is split into first split pad electrodes 41*a*, 42*a* and 43*a* and second split pad electrodes 41*b*, 42*b* and 43*b*. The first split pad electrodes 41*a*, 42*a* and 43*a* in each layer are respectively connected through via wirings 44*a* and 44*b* and to a MOSFET. The second split pad electrodes 41*b*, 42*b* and 43*b* in each layer are separated with a clearance 16 from the first split pad electrodes 41*a*, 42*a* and 43*a* in each layer respectively and made to be floating electrodes.

According to the aforementioned fourth embodiment, the same effects as in the first embodiment can be obtained by disposing the first and second electrodes 41*a*, 41*b*, 42*a*, 42*b*, 43*a* and 43*b*.

Further, each layer is provided with the first and second split pad electrodes 41*a*, 41*b*, 42*a*, 42*b*, 43*a* and 43*b*. Therefore, even in the case where the characteristics of each layer are evaluated, the area of a charge introduction port can be minimized in each layer. Therefore, charging damages can be most reduced and a deterioration in the characteristics of the MOSFET can be prevented.

It is to be noted that the split pad electrodes 43*a* and 43*b* on the uppermost layer in the fourth embodiment may be covered with a non-split pad electrode in the same manner as in the second embodiment. In this case, not only the effects of the fourth embodiment are obtained but also corrosion of the split pad electrodes 43*a* and 43*b* can be prevented.

(Fifth embodiment)

In a fifth embodiment, examples of a pattern of the split pad electrode used in each of the aforementioned first to fourth embodiments will be explained.

FIG. 18A to FIG. 18K respectively show a plan view of a pattern of a split pad electrode according to an embodiment of the present invention. Here, a first split pad electrode 51*a* is connected to wirings and a MOSFET and a second split pad electrode 51*b* is made to be a floating electrode.

Figure 18A:
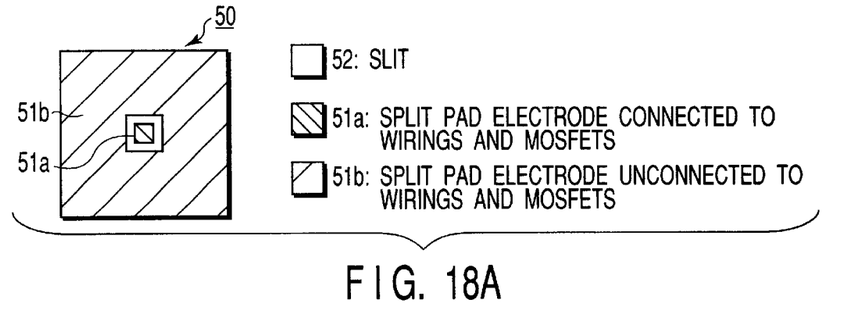
FIG. 18A is a plan view showing the pattern of a split pad electrode according to a fifth embodiment of the present invention.

As shown in FIG. 18A, a first split pad electrode 51*a* is disposed in the center of a pad electrode 50 and a second split pad electrode 51*b* is disposed apart from the first split pad electrode 51*a* so as to surround the first split pad electrode 51*a* in the same manner as in the first embodiment.

Figure 18B:
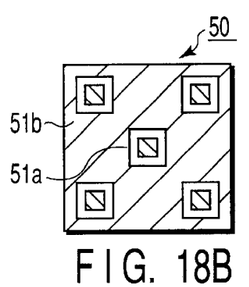
FIG. 18B is a plan view showing the pattern of a split pad electrode according to the fifth embodiment of the present invention.
Figure 18C:
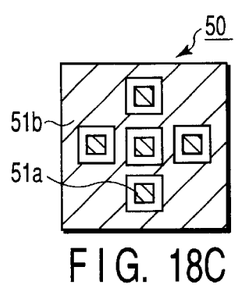
FIG. 18C is a plan view showing the pattern of a split pad electrode according to the fifth embodiment of the present invention.

As shown in FIG. 18B, plural first split pad electrodes 51*a* are disposed in the center of a pad electrode 50 and a second split pad electrode 51*b* is disposed apart from each of these first split pad electrodes 51*a* so as to surround each first split pad electrode 51*a* in the same manner as in the third embodiment. FIG. 18C shows an example of a modification as to the position of the first split pad electrode 51*a* shown in FIG. 18B.

Figure 18D:
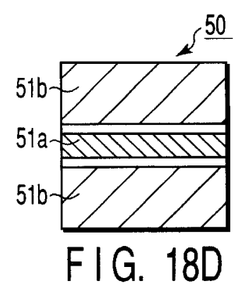
FIG. 18D is a plan view showing the pattern of a split pad electrode according to the fifth embodiment of the present invention.

As shown in FIG. 18D, a first split pad electrode 51*a* may be disposed so as to traverse the center of a pad electrode 50 and a second pad electrode 51*b* may be disposed apart from the first split pad electrode 51*a* so as to sandwich the first split pad electrode 51*a*.

Figure 18E:
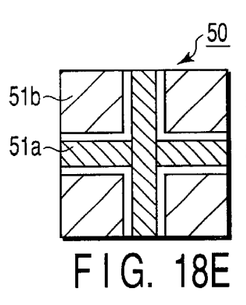
FIG. 18E is a plan view showing the pattern of a split pad electrode according to the fifth embodiment of the present invention.

As shown in FIG. 18E, a first split pad electrode 51*a* may be disposed in a cross form in the center of a pad electrode 50 and a second split pad electrode 51*b* may be disposed apart from the first split pad electrode 51*a* at each of the four corners of the pad electrode 50.

Figure 18F:
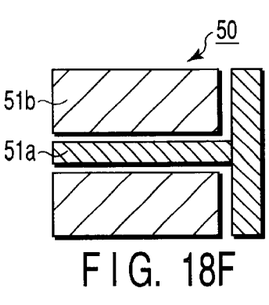
FIG. 18F is a plan view showing the pattern of a split pad electrode according to the fifth embodiment of the present invention.

As shown in FIG. 18F, a T-shaped split pad electrode 51*a* may be disposed in a pad electrode 50 and a second split pad electrode 51*b* may be disposed apart from the first split pad electrode 51*a*.

Figure 18G:
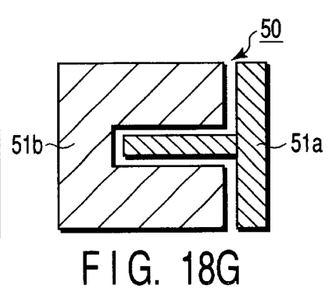
FIG. 18G is a plan view showing the pattern of a split pad electrode according to the fifth embodiment of the present invention.

FIG. 18G is an example of a modification of FIG. 18F. The first split pad electrode 51*a* may not be disposed up to the end of the pad electrode 50 and the second split pad electrode 51*b* may be made into a concave type.

Figure 18H:
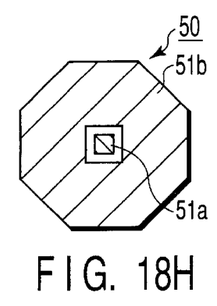
FIG. 18H is a plan view showing the pattern of a split pad electrode according to the fifth embodiment of the present invention.

FIG. 18H is an example of a modification of FIG. 18A, the four corners of the pad electrode 50 may be cut off and the pad electrode 50 may be made into an octagonal shape.

Figure 18I:
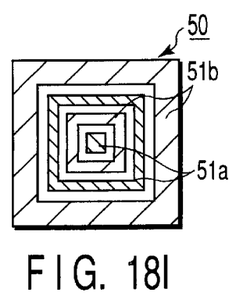
FIG. 18I is a plan view showing the pattern of a split pad electrode according to the fifth embodiment of the present invention.

FIG. 18I is an example of a modification of FIG. 18A. The first split pad electrode 51*a* and the second split pad electrode 51*b* are formed alternately so as to surround the outer periphery.

FIG. 18J and FIG. 18K are examples of modifications of FIG. 18B and FIG. 18C respectively. A slit 52 may be disposed in a region (second split pad electrode 51*b*) where the first pad electrode 51*a* is not formed in the pad electrode 50. The provision of this slit 52 can decrease stress against the pad electrode 50.

Although the layout of the split pad electrodes 51*a* and 51*b* is not limited to the layout shown in the aforementioned FIG. 18A to FIG. 18K, the layout in which the first split pad electrode 51*a* is formed like an island in the center of the pad electrode 50 as shown in FIG. 18A to FIG. 18H is most preferable. When the size of the first split pad electrode 51*a* is entirely smaller than the contact surface between a connecting member such as a bonding wire or a bump and the pad electrode 50, specifically, if the device has a structure in which the first split pad electrode 51*a* and its peripheral clearance are all covered with the connecting member, a phenomenon that the first split pad electrode 51*a* is smashed during bonding so that the first split pad electrode 51*a* is easily brought into contact with the second split pad electrode 51*b* and the side surface of the split pad electrode 50 is in contact directly with a resin used for sealing a semiconductor device does not occur. Therefore, when the layout shown in FIG. 18A or FIG. 18H is adopted and the size of the first split pad electrode 51*a* is much smaller than the contact area between the pad electrode 50 and the connecting member, the effect of preventing corrosion is raised.

Also, the first split pad electrode 51*a* is preferably formed in the center of the pad electrode 50. It is thereby possible to decrease the possibility of the first split pad electrode 51*a* being in non-contact with a bonding wire, a bump, a probe or the like.

(Sixth embodiment)

As aforementioned, the area of a split pad electrode to be connected to wirings and a MOSFET in a semiconductor device is preferably small to suppress charging damages. However, if the number of via wirings to be connected to a split pad electrode having a small surface area is small, there is a case where a troublesome problem that necessary current cannot be supplied is imposed in this via wiring section. This is because there is a limitation to allowable current density defined by resistance to electromigration. It is therefore undesirable to connect a split pad electrode having a small surface area to a wiring required to consider the resistance to electromigration rather than to suppress charging damages.

In the meantime, parts which easily receive charging damages include a signal line for which a pad is connected directly to a gate electrode of a MOSFET. Because this signal line does not usually require high density current, a resistance to electromigration may not be much considered. Therefore, it is desirable to connect a split pad electrode having a small area to such a signal line.

Based on the above explanations, in the sixth embodiment, the split pad electrode according to the present invention is applied to only a part or all of signal lines and a conventional non-split pad electrode is applied to other wirings.

Figure 19:
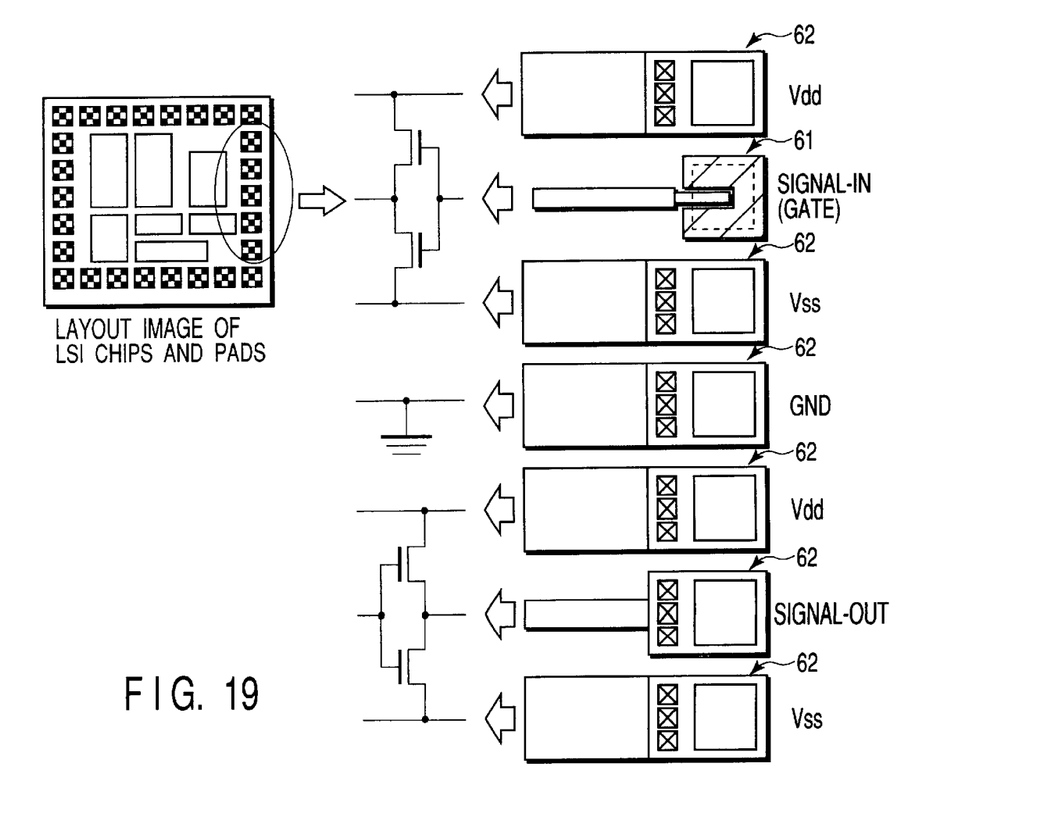
FIG. 19 is a view typically showing a semiconductor device according a sixth embodiment of the present invention.

FIG. 19 shows an example in which the split pad electrode according to the present invention and a conventional non-split pad electrode are mounted together and applied.

As shown in FIG. 19, because a signal line connected to a gate electrode (Signal-In) does not usually require high density current, a split pad electrode 61 according to the present invention is applied. On the other hand, in the case of power lines or the like (Vdd, Vss, GND and Signal-Out), a restriction on charging damages is not of importance. However, it is necessary to flow high density current and therefore a conventional non-split Pad electrode 62 is applied. It is to be noted that the split pad electrode 61 according to the present invention may be applied to all signal lines.

According to the aforementioned sixth embodiment, the split pad electrode 61 is applied to signal lines connected to a gate electrode and a non-split pad electrode 62 is applied to wirings through which high density current must be flowed. Therefore, a consideration for a resistance to electromigration and a restriction on charging damages can be compatible.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device provided with a semiconductor element and a wiring, the device comprising:
   a first split pad electrode which is electrically connected to said semiconductor element through said wiring;
   a second split electrode which is disposed adjacent to and apart from said first split pad electrode and is not electrically connected to said semiconductor element;
   an insulating film formed between said first split pad electrode and said second split pad electrode, an upper surface of said insulating film being substantially level with upper surfaces of said first and said second split pad electrodes;
   a passivation film which covers a part of said upper surface of said second split pad electrode; and
   a non-split pad electrode formed on said upper surface of said first split pad electrode, said upper surface of said second split pad electrode and said upper surface of said insulating film.

2. A semiconductor device provided with a semiconductor element and a wiring, the device comprising:

a first split pad electrode which is electrically connected to said semiconductor element through said wiring;

a second split pad electrode which is disposed adjacent to and apart from said first split pad electrode and is not electrically connected to said semiconductor element;

a first insulating film formed between said first split pad electrode and said second split pad electrode, an upper surface of said insulating film being substantially level with upper surfaces of said first and second split pad electrodes;

a third split pad electrode electrically connected to said first split pad electrode;

a fourth split pad electrode disposed around and apart from said third split pad electrode and not electrically connected to said semiconductor element; and a second insulating film formed between said third split pad electrode and said fourth split pad electrode, an upper surface of said second insulating film being substantially level with surfaces of said third and said fourth split pad electrodes.

3. A semiconductor device provided with a signal line and a power line, comprising:

a first pad electrode which is split into a first split pad electrode and a second split pad electrode and is used as a pad electrode for said signal line, said first split pad electrode being electrically connected to a semiconductor element through a wiring, and said second split pad electrode being disposed around and apart from said first split pad electrode and being not electrically connected to said semiconductor element; and a second split pad electrode which is electrically connected to said semiconductor element through a wiring and is used as a pad electrode for said power line, said second pad electrode being a non-split pad electrode.

4. A semiconductor device provided with a semiconductor element and a wiring, the device comprising:

an island-like first split pad electrode which is electrically connected to said semiconductor element through said wiring;

a second split pad electrode which is disposed around and apart from said first split pad electrode and is not electrically connected to said semiconductor element;

an insulating film formed between said first split pad electrode and said second split pad electrode, an upper surface of said insulating film being substantially level with upper surfaces of said first and said second split pad electrodes;

a passivation film which covers a part of said upper surface of said second split pad electrode; and a connecting member disposed on the exposed upper surfaces of said insulating film and a pad electrode constituted by said first and second split pad electrodes, wherein a surface where said connecting member contacts both said pad electrode and said insulating film is formed in such a manner as to surround the inner periphery of said second split pad electrode.

5. A semiconductor device provided with a semiconductor element and a wiring, the device comprising:

a first split pad electrode which is electrically connected to said semiconductor elements through said wiring;

a second split pad electrode which is disposed adjacent to and apart from said first split pad electrode and is not electrically connected to said semiconductor element;

an insulating film formed between said first split pad electrode and said second split pad electrode, an upper surface of said insulating film being substantially level with upper surface of said first and second split pad electrodes; and a passivation film which covers a part of said upper surface of said second split pad electrode, wherein said upper surface of said first split pad electrodes, said upper surface of said second split pad electrode, and said upper surface of said insulating film are exposed in the same opening of said passivation film.

6. A semiconductor device provided with a semiconductor element and a wiring according to claim 1, wherein said non-split pad electrode is formed by CMP or wet etching.

7. A semiconductor device provided with a semiconductor element and a wiring according to claim 1, wherein said first split pad electrode is disposed in the plural.

8. A semiconductor device provided with a semiconductor element and a wiring according to claim 2, wherein said first split pad electrode is disposed in the plural.

9. A semiconductor device provided with a signal line and a power line according to claim 3, wherein said first split pad electrode is disposed in the plural.

10. A semiconductor device provided with a semiconductor element and a wiring according to claim 4, wherein said first split pad electrode is disposed in the plural.

11. A semiconductor device provided with a semiconductor element and a wiring according to claim 5, wherein said first split pad electrode is disposed in the plural.

12. A semiconductor device provided with a semiconductor element and a wiring according to claim 1, wherein said first and second split pad electrodes respectively have a damascene structure.

13. A semiconductor device provided with a semiconductor element and a wiring according to claim 2, wherein said first and second split pad electrodes respectively have a damascene structure.

14. A semiconductor device provided with a signal line and a power line according to claim 3, wherein said first and second split pad electrodes respectively have a damascene structure.

15. A semiconductor device provided with a semiconductor element and a wiring according to claim 4, wherein said first and second split pad electrodes respectively have a damascene structure.

16. A semiconductor device provided with a semiconductor element and a wiring according to claim 5, wherein said first and second split pad electrodes respectively have a damascene structure.

17. A semiconductor device provided with a semiconductor element and a wiring according to claim 4, wherein said connecting member is a bonding wire or a bump.

18. A semiconductor device provided with a semiconductor element and a wiring according to claim 1, wherein said second split pad electrode is provided with a slit.

19. A semiconductor device provided with a semiconductor element and a wiring according to claim 2, wherein said second split pad electrode is provided with a slit.

20. A semiconductor device provided with a signal line and a power line according to claim 3, wherein said second split pad electrode is provided with a slit.

21. A semiconductor device provided with a semiconductor element and a wiring according to claim 4, wherein said second split pad electrode is provided with a slit.

22. A semiconductor device provided with a semiconductor element and a wiring according to claim 5, wherein said second split pad electrode is provided with a slit.

23. A semiconductor device provided with a signal line and a power line according to claim 3, wherein said semiconductor element is a transistor comprising a gate electrode, and said first split pad electrode is electrically connected to said gate electrode.

24. A semiconductor device provided with a semiconductor element and wiring according to claim 1, wherein said first split pad electrode is surrounded by said second split pad electrode.

25. A semiconductor device provided with a semiconductor element and a wiring according to claim 2, wherein said first split pad electrode is surrounded by said second split pad electrode, and said third split electrode is surround by said fourth split pad electrode.

26. A semiconductor device provided with a signal line and power line according to claim 3, wherein said first split pad electrode is surrounded by said second split pad electrode.

27. A semiconductor device provided with a semiconductor element and a wiring according to claim 4, wherein said first split pad electrode is surrounded by said second split pad electrode.

28. A semiconductor device provided with a semiconductor element and a wiring according to claim 5, wherein said first split pad electrode is surrounded by said second split pad electrode.

29. A semiconductor device provided with a signal line and a power line according to claim 23, wherein said first split pad electrode is surrounded by said second split pad electrode.

30. A semiconductor device provided with a semiconductor element and a wiring according to claim 1, wherein an upper surface of said non-split pad electrode is substantially level with an upper surface of said passivation film.

31. A semiconductor device provided with a semiconductor element and a wiring according to claim 30, wherein said non-split pad electrode comprises:

a first part formed on said upper surface of said first split pad electrode, said second split electrode and said insulating film; and a second part formed on said first, a side surface of said second part protruding outward more than a side surface of said first part.

\* \* \* \* \*

UNITED STATES PATENT AND TRADEMARK OFFICE
CERTIFICATE OF CORRECTION

PATENT NO. : 6,504,252 B2
DATED : January 7, 2003
INVENTOR(S) : Matsunaga

It is certified that error appears in the above-identified patent and that said Letters Patent is hereby corrected as shown below:

Column 12,
Line 52, after "a second split", insert -- pad --.

Column 15,
Line 10, after "said third split", insert -- pad --; and "is surround" should read -- is surrounded --.

Column 16,
Line 15, after "said second split", insert -- pad --.
Line 17, "said first," should read -- said first part, --.

Signed and Sealed this

Fifteenth Day of April, 2003

JAMES E. ROGAN
*Director of the United States Patent and Trademark Office*